United States Patent [19]
Tamura

[11] Patent Number: 5,825,627
[45] Date of Patent: Oct. 20, 1998

[54] MULTISTAGE-COUPLED MODULES HAVING ELECTRONIC PARTS

[75] Inventor: Tetsuya Tamura, Tokyo, Japan

[73] Assignee: NEC Corporation, Tokyo, Japan

[21] Appl. No.: 966,561

[22] Filed: Nov. 10, 1997

[30] Foreign Application Priority Data

Nov. 11, 1996 [JP] Japan ................................. 8-298988

[51] Int. Cl.⁶ .................................................. H05K 7/00
[52] U.S. Cl. .......................... 361/730; 361/732; 361/735; 439/928; 439/953
[58] Field of Search ..................................... 361/732, 733, 361/735, 790, 729, 730, 731; 439/928, 953, 372; 174/59

[56] References Cited

U.S. PATENT DOCUMENTS

| | | | |
|---|---|---|---|
| 3,340,439 | 9/1967 | Henschen et al. | 361/735 |
| 4,501,460 | 2/1985 | Sisler | 361/732 |
| 4,558,914 | 12/1985 | Prager et al. | 439/928 |
| 4,858,070 | 8/1989 | Buron et al. | 439/928 |
| 5,508,886 | 4/1996 | Bernecker et al. | 361/732 |
| 5,515,239 | 5/1996 | Kamerman et al. | 361/727 |
| 5,564,802 | 10/1996 | Chiou | 439/928 |
| 5,676,553 | 10/1997 | Leung | 439/928 |
| 5,677,830 | 10/1997 | Nogas et al. | 361/735 |

FOREIGN PATENT DOCUMENTS

| | | | |
|---|---|---|---|
| 2 222 769 | 10/1974 | France | H01R 33/00 |
| 29 601 864 | 9/1996 | Germany | F16M 1/00 |
| 2-054401 | 2/1990 | Japan | G11B 5/012 |
| 8-221154 | 8/1996 | Japan | G06F 1/18 |
| 8-221154 A | 8/1996 | Japan | G06F 1/18 |
| WO 96/00938 | 1/1996 | WIPO | G06F 1/16 |

*Primary Examiner*—Gregory Thompson
*Assistant Examiner*—John B. Vigushin
*Attorney, Agent, or Firm*—Young & Thompson

[57] ABSTRACT

A computer system is implemented by a plurality of electronic modules having different parts, cascaded in the vertical direction and each having a similar configuration. Adjacent two of the modules are coupled by rotating a pair of lock dials to a lock position at which the locked pin of the protrusion is engaged with a helical groove formed in the lock dials. A common signal bus is formed by engagement of a plug and receptacle at the locked position. The adjacent modules are separated by rotating the lock dial to an open position.

18 Claims, 5 Drawing Sheets

MULTISTAGE-COUPLED MODULES HAVING ELECTRONIC PARTS

BACKGROUND OF THE INVENTION (a) Field of the Invention

The present invention relates to a multistage-coupled modules mounting electronic parts thereon and, in particular, to such modules for use as electronic components in a personal computer system.

(b) Description of the Related Art

A conventional personal computer, as shown in FIG. 1, generally comprises a planar base frame 52, a variety of components mounted on the base frame 52 and a plurality of circuit boards 53 which in turn have mounted thereon respective circuit elements. A floppy disk drive 54, a hard disk drive 55, a power supply module 56, an extension cage 57 for receiving extension substrates therein, and other various functional components 58 are also mounted on the base frame 52. The base frame 52 is received in a casing or housing 59 made of a metal or a synthetic resin.

In the personal computer as mentioned above, all of the circuit boards 53 and functional components 58 are electrically connected to the base frame 52 either directly or indirectly through other interposed electronic parts. Mechanical coupling utilizes screws, bolts and nuts of different shapes, sizes and/or materials, as well as a snap fit or an adhesive. On the other hand, an electrical connection generally uses a variety of connectors of different configurations which depend on components to be connected.

To adapt a personal computer with a specific application software or instrument, extension of circuit components is sometimes requested to the circuit boards and/or extension cage as well as a replacement or addition of drives for driving a variety of storage media. To facilitate such an extension and/or replacement, coin screws are generally used to secure the casing to the base frame for facilitating replacement or extension of the circuit boards without a specific tool. The extension or replacement of a specific circuit board is also achieved by removing a cover plate for the slot of the extension cage.

In particular, since the personal computer is in widespread use at a sharply increasing rate, it necessarily follows that the need for maintenance increases. With personal computers of a so-called DOS/V type, for example, users are frequently disassembling and re-assembling for enhancement of the hardware as desired, and accordingly, a further facilitating of these operations will be one of the most important tasks for the manufacturers.

In the conventional computer as described above, all of the circuit boards, circuit components and drives are mounted on a single base frame and are received within a single casing. Accordingly, in the event of a failure, the casing must be removed and the electronic parts must be separated or connected while distinguishing a number of different connectors from one other, thereby requiring an elaborate work and causing a mistake during separation or connection of the connectors. There is no assurance for reliable connections of the connectors after the recovery from the failure.

SUMMARY OF THE INVENTION

It is therefore an object of the present invention to provide an electronic module having therein specific electronic parts and capable of being cascaded as one of the multistage-coupled modules, thereby allowing facilitation of extension or separation of electronic parts in a personal computers.

The present invention provides an electronic module comprising a module housing and an electronic part mounted by the module housing, the module housing having a first surface and a second surface opposed to each other, the first surface mounting thereon a depression element at a first location, the second surface mounting thereon a protrusion element at a second location corresponding to the fist location, the depression element and the protrusion element having corresponding configurations for allowing two of the module housings to be coupled with each other.

In a preferred embodiment of the present invention, one of the depression element and the protrusion element has a helical groove, the other of the depression element and the protrusion element has a lock pin having a configuration corresponding to a configuration of a cross-section of the helical groove, and one of the depression element and protrusion element is pivotally mounted by the module housing.

In accordance with the preferred embodiment of the present invention, a plurality of electronic modules can be coupled with one another simply by turning the pivotable one of the protrusion element and the depression element, with the lock pin being engaged with the helical groove, thereby forming an electronic system. The coupling of the modules allows easy assembly or extension of a computer system, for example, and the decoupling of the modules allows an easy replacement of the modules.

In one aspect of the present invention, a computer system is implemented by a plurality of electronic modules having different parts, cascaded in the vertical direction and each having a similar configuration. Adjacent two of the modules are coupled by rotating a pair of lock dials to a lock position at which the lock pin of the protrusion is engaged with a helical groove formed in the lock dials. A common signal bus is formed by engagement of a plug and receptacle at the lock position.

The above and other objects, features and advantages of the present invention will be more apparent from the following description, referring to the accompanying drawings.

DESCRIPTION OF THE PREFERRED EMBODIMENT

Now, the present invention is more specifically described with reference to accompanying drawings.

Figure 1:
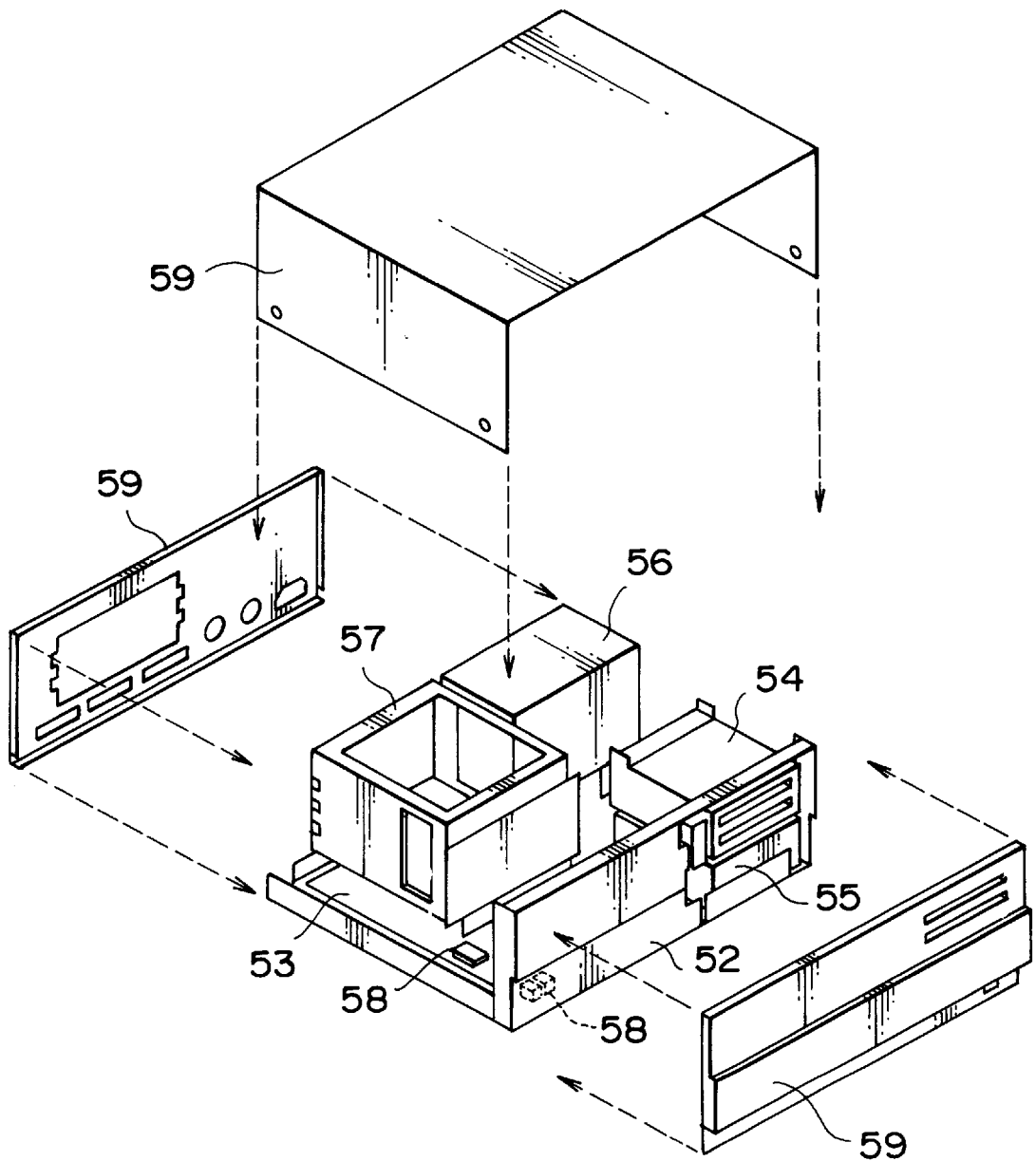
FIG. 1 is an exploded perspective view of a conventional personal computer.
Figure 2A:
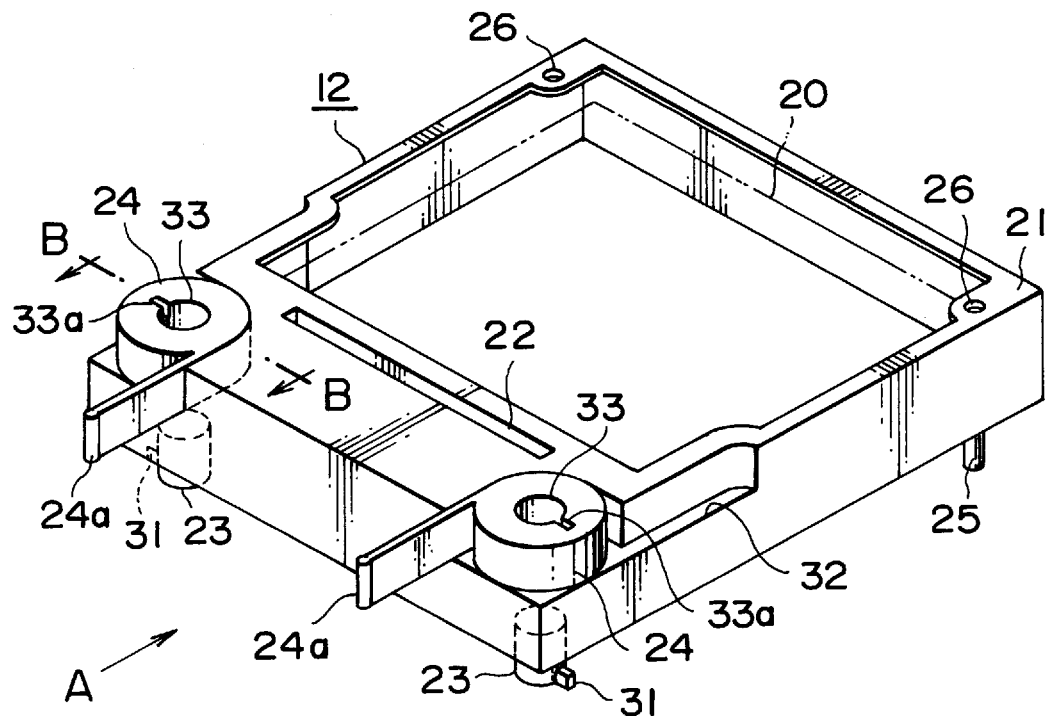
FIGS. 2A and 2B are a schematic perspective view and a front view, respectively, of an electronic module according to an embodiment of the present invention.
Figure 2B:
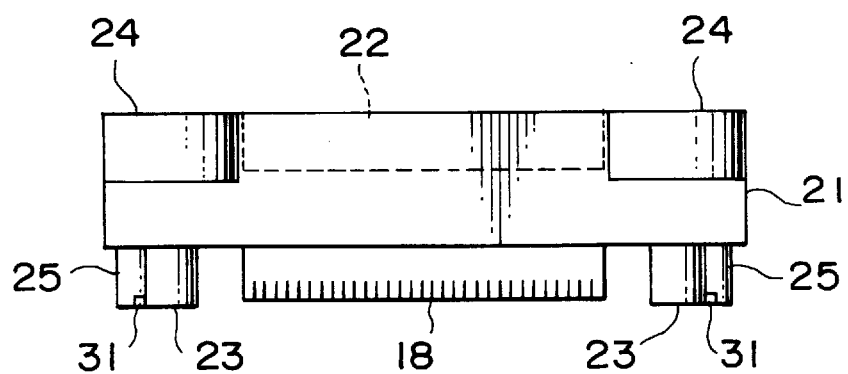

Referring to FIGS. 2A and 2B, an electronic module according to an embodiment of the present invention comprises a module housing 21 having a front deck portion and a receiving portion for receiving electronic parts 20 therein. The module housing 21 mounts a pair of rotatable or pivotable lock dials (depression element) 24 of a locking mechanism disposed on the top surface of the front deck portion of the module housing 21 at a pair of recesses formed in the vicinities of both the front corners of the module housing 21. Each of the lock dials 24 has a cylindrical body pivotally mounted on the module housing 21, a side handle or lock handle 24a for turning the cylindrical body in the clockwise or counter-clockwise direction, and a central, cylindrical depression 33 formed in the cylindrical body and having an inner wall formed with a helical groove 33a. Each of the lock dials 24 can be reciprocally turned between a first, open position shown in FIG. 2A, at which the lock dial 24 is stopped by the wall of the recess abutting the side handle 24a and a second, closed position, shown in FIG. 3, at which the side handle 24a is stopped by the side wall 12 of the module housing 21. The angle for which the lock dial 24 can be turned is approximately 180 degrees.

The module housing 21 has a pair of protrusions 23 of the locking mechanism on the bottom of the module housing 21 at the locations corresponding to the depressions 33 of the pair of lock dials 24 for engaging the lock dials 24 of an adjacent module with the protrusions 23. It is to be noted that the depression 33 can be turned around the center of the helix of the helical groove 33a.

The protrusions 23 have a length slightly less than the length of the depressions 33 of the lock dials 24, and have a thickness slightly less than the diameter of the depressions 33 of the lock dials 24. Each of the protrusions 23 has a fixed lock pin 31 which extends in the direction away from the center of the front edge of the module housing 21 and can be engaged with the helical groove 33a of the depression 33 of the adjacent module. It will be noted that the lock pin 31 is disposed at the bottom end of the protrusion 23.

A pair of elongated plug 18 (FIG. 2B) and elongated receptacle 22 extending parallel to the front edge of the module housing 21 are disposed on the bottom and top surfaces, respectively, of the front deck portion of the module housing 21 in the vicinity of the front edge of the module housing 21 between the locking mechanisms 24 and 23. The plug 18 shown in FIG. 2B constitutes one of the end terminals of the signal bus which are connected to the electronic parts 20 in the module, whereas the receptacle 22 constitutes the other of the end terminals of the signal bus connected to the electronic parts 20.

The module housing 21 also has a pair of alignment pins 25 and a pair of alignment holes 26 at the bottom and top, respectively, of the rear corners of the module housing 21 for alignment with adjacent modules.

The module housing 21 is formed substantially as a box or casing made of an aluminum sheet. The module housing 21 may be made of an iron sheet, magnesium alloy or the like or a synthetic resin instead. The electronic parts 20 disposed within the module housing 21 may constitute a CPU board, a CD-ROM unit, a PCMCIA card throttle, a TV tuner, a hard disk drive, a power supply module and an attachment thereto or other extension unit. A single module housing may contain a plurality of CPU boards, for example, disposed apart from one another.

Each of the lock dials 24 is disposed within a corner recess formed on the top surface of the front deck portion of the module housing 21 so that the top surface of the lock dial 24 is flush with the top surface of the other portion of the module housing 21. For the left-hand lock dial 24, as viewed from the front or in the direction indicated by the arrow "A" shown in FIG. 2A, the handle 24a is stopped, after a counter-clockwise rotation into the open position, by the engagement of the side handle 24a with the corner of the recess, whereas the right-hand lock dial 24 is stopped after a clockwise rotation into the open position.

Figure 3:
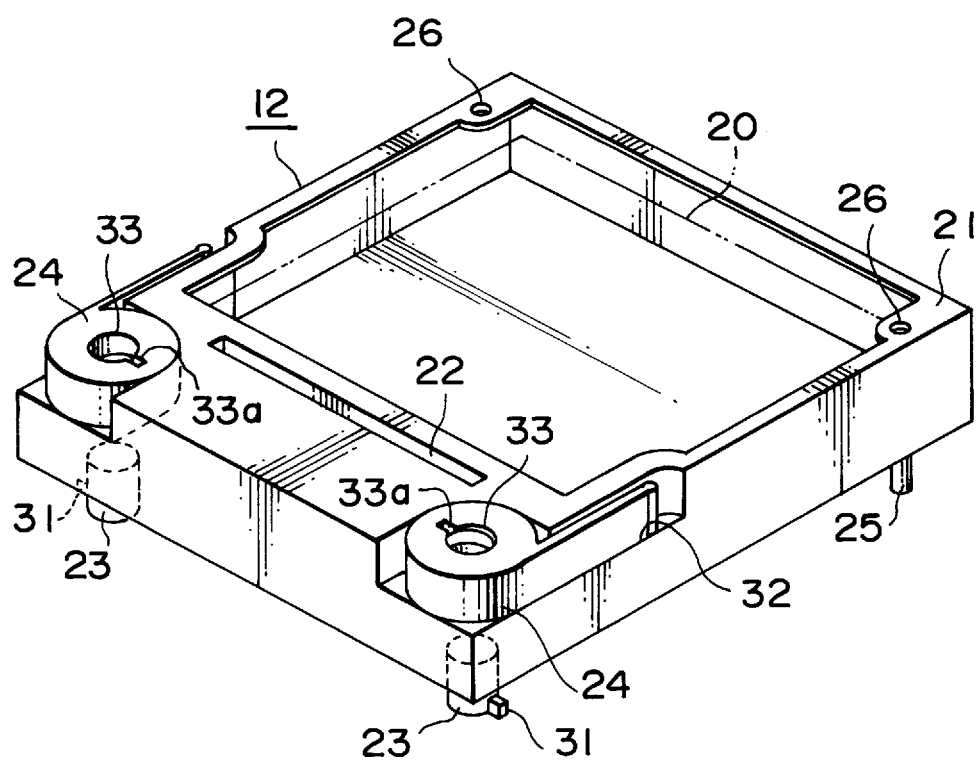
FIG. 3 is another perspective view of the module of FIG. 1A with its side handles being in a closed position.

The module housing 21 has a pair of spaces at the side surfaces thereof, as shown in FIG. 3, for receiving the side handles 24a in the closed position after the side handle 24a is turned against the side surfaces of the module housing 21 so that the surface of the side handle 24a is flush with the side surface of the module housing 21.

In the present embodiment, to minimize the number of electronic parts in view of recycle and disposal, the protrusions 23 and the alignment pins 25 are formed as the integral parts of the module housing 21, which is molded from recycled ABS resin. It should be understood that a metallic material such as aluminum or magnesium alloy may also be used for the module housing 21. The lock dial 24 and the locking pin 25 may be made as separate parts instead from the ABS resin and adhered to the module housing 21 after the molding.

A plurality of modules of the same configuration as described above and mounting thereon different functional parts are coupled to form a computer system implemented by multistage coupled modules.

Figure 4A:
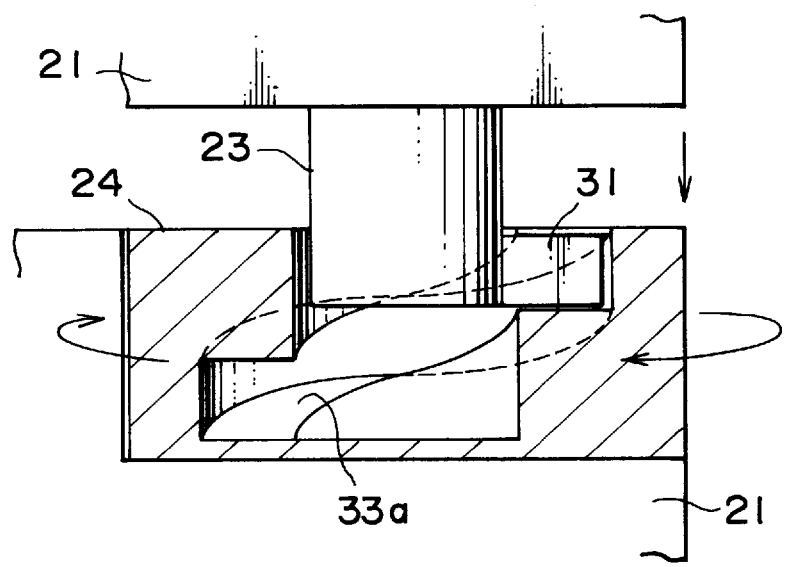
FIGS. 4A and 4B are cross sectional views taken along B—B in FIG. 2A before and after, respectively, the coupling of the module housings.
Figure 4B:
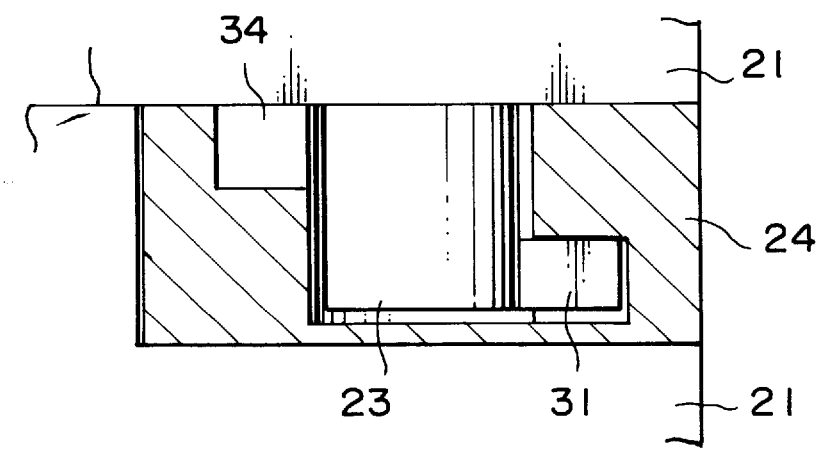

Referring to FIGS. 4A and 4B, there is shown an engagement of the protrusion 23 having the lock pin 31 with the depression 33 of the lock dial 24 for coupling two of the adjacent modules 21, with one placed above the other. Before coupling the two modules, the side handle 24a is maintained in the open position in the lower module 21, as shown in FIG. 2A, and the lock pin 31 of the protrusion 23 of the upper module 21 is fitted into the open end of the helical groove 33a formed in the depression 33 of the lower module. It will be appreciated that the alignment pin 25 of the upper module 21 is aligned with and inserted into the alignment holes 26 of the lower module 21. Under this state, the plug of the upper module 21 is also aligned with the receptacle 22 of the lower module 21 shown in FIG. 4A.

The helical groove 33a extends from the top portion to the bottom portion of the depression 33 along substantially the half cylindrical wall portion of the depression 33. When the side handle 24a is operated to turn the lock dial 24 in the direction indicated by the arrow shown in FIG. 4A, the protrusion 23 advances with the lock pin 31 guided along the helical groove 33a. At the same time, the alignment pins 25 are driven into the alignment holes 26, and the receptacle 22 is engaged with the plug 28 for electrical connection. In this manner, the lower and the upper modules 21 are coupled with each other.

The lock dial 24 is rotated by substantially 180° until the protrusion 23 is stopped by the bottom of the depression 33. After the turn, the handle 24a is in the closed position, as shown in FIG. 3, and the lock pin 31 of the protrusion 23 rests on the bottom of the helical groove 33a, as shown in FIG. 4B, whereupon the upper module 21 is pressed against the lower module 21, and the receptacle 22 and the plug 28 are firmly coupled together. In FIG. 4B, the helical groove 33a is located at the near side of the cross section after it is turned by 180° from the location shown in FIG. 4A, and not depicted in FIG. 4B.

After the receptacle 22 of the lower module 21 is connected with the plug 18 of the upper module 21, a common signal bus is formed by coupling the two signal bus portions, thereby allowing cooperation between the electronic components disposed in both the modules.

Figure 5:
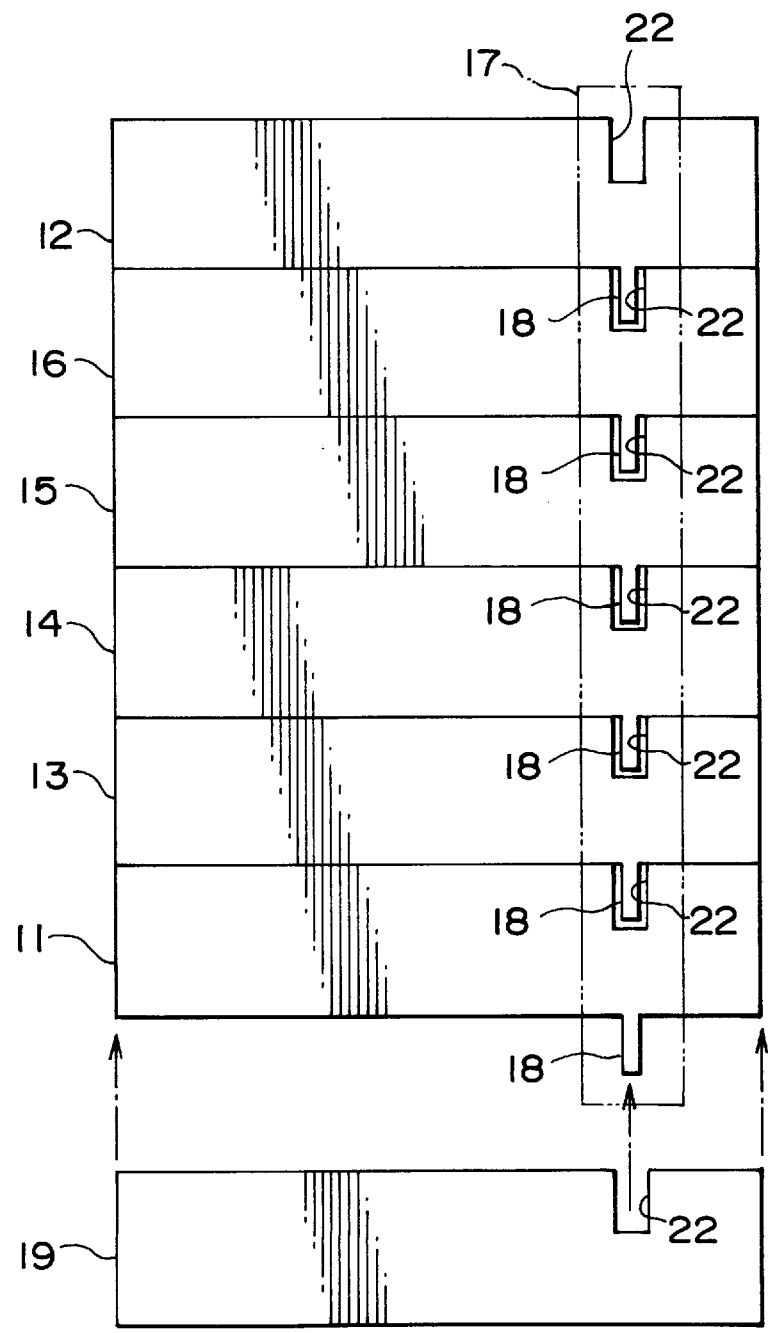
FIG. 5 is a side view of a new computer system including multistage-coupled modules according to the present invention.

Referring to FIG. 5, there is shown a computer system including a plurality of modules according to the present embodiment coupled together to form multistage coupled modules. The computer system includes, from the top to the bottom, CPU module 12, CD-ROM module 16, CPMCIA card throttle module 15, TV tuner module 14, hard disk module 13, power supply module 11, with the signal bus being connected by the plugs 18 and receptacles 22 of the modules for implementing a common bus 17. In this manner, the function of a so-called "multi-media personal computer" is realized by close transmission/reception of signals between the modules of different functions. If a new type of module is developed after the installation of the computer system, it may be added at the bottom as an extension module 19, which may be a floppy disk drive, extension RAM, sound board, internet board, SCSI board, accelerator board or the like, to allow the extended module 19 to cooperate with other modules 11 to 16. If the appearance is tailored for the respective module housings 21, an outer casing is not necessary to receive the entire modules as a desk top system. In the case of using the multistage coupled modules as a desk top computer, it is desirable to provide a mounting base at the bottom of the lowest stage of the modules.

If one of the modules turns out unnecessary after installation or if it is to be replaced by a substitute module having a higher performance, it is sufficient to turn the side handles 24a of the unnecessary module and the adjacent lower module into the open position for separation of the unnecessary module. As a result, the decoupling of the modules including disconnection of the electric connector is effected, thereby allowing the immediate removal of the unnecessary module. After the removal, the new module is inserted instead of the removed module, then the corresponding side handles are turned into the closed position.

In the present embodiment, the combination of the helical groove and the lock pin allows coupling of the adjacent module housings with a stable strength and decoupling thereof without a tool such as a screw driver. The multistage cascaded-structure also allows saving the space.

The configuration of the lock dial and its side handle allows a quick and easy coupling/decoupling of the adjacent modules. The combination of the alignment pin and holes allows easy alignment and stable coupling.

The arrangement of the plug and receptacle disposed between the locking mechanisms allows a stable coupling without the need of observation for a fine alignment therebetween. The common signal bus formed by the coupling of the electric connector removes the burden for the user. The arrangement of the pair of lock dials, pair of protrusions, pair of lock pins and pair of lock holes at all corners of the module housing allows a firm and stable coupling.

Especially, the multistage arrangement of the modules allows reduction of spaces therefor and the spaces reserved for future use, reduction of signal propagation time, and reduction of wiring space. It also allows omission of an outer casing.

In a modified arrangement, the protrusion may have a helical groove and the depression of the lock dial may have a lock pin. The modules may have a vent between the adjacent modules and a cooling fan may be provided for ventilation.

Since the above embodiment are described only for an example, the present invention is not limited to the above embodiment and various modifications or alterations can be easily made therefrom by those skilled in the art without departing from the scope of the present invention.

What is claimed is:

1. An electronic module comprising a module housing and an electronic part mounted by said module housing, said module housing having a first surface and a second surface opposed to each other, said first surface mounting thereon a depression element at a first location, said second surface mounting thereon a protrusion element at a second location corresponding to said first location, said depression element and said protrusion element having corresponding configurations for allowing two of said module housings to be coupled with each other, wherein one of said depression element and said protrusion element has a helical groove, the other of said depression element and said protrusion element has a lock pin having a configuration corresponding to a configuration of a cross-section of said helical groove, and one of said depression element and protrusion element is pivotally mounted by said module housing, and wherein said depression element is cylindrical and has a handle for rotation.

2. An electronic module as defined in claim 1, wherein a top surface of said depression element is flush with a top surface of said first surface.

3. An electronic module as defined in claim 2, wherein said depression element is rotatable between a first position and a second position, and a surface of said handle is flush with a third surface of said module housing at one of said first position and second position.

4. An electronic system comprising a plurality of electronic modules as defined in claim 1, wherein adjacent two of said electronic modules are coupled together by engagement of said lock pin of one of said adjacent two of said electronic modules with said helical groove of the other of said adjacent two of said electronic modules.

5. An electronic module comprising a module housing and an electronic part mounted by said module housing, said module housing having a first surface and a second surface opposed to each other, said first surface mounting thereon a depression element at a first location, said second surface mounting thereon a protrusion element at a second location corresponding to said first location, said depression element and said protrusion element having corresponding configurations for allowing two of said module housings to be coupled with each other, wherein one of said depression element and said protrusion element has a helical groove, the other of said depression element and said protrusion element has a lock pin having a configuration corresponding to a configuration of a cross-section of said helical groove, and one of said depression element and protrusion element is pivotally mounted by said module housing, and wherein one of said first surface and said second surface further mounts at least one alignment pin, and the other of said first surface and said second surface mounts an alignment hole having a configuration corresponding to a configuration of said alignment pin.

6. An electronic module as defined in claim 5, wherein a pair of said depression elements and a pair of said alignment pins or a pair of said alignment holes are arranged in the vicinities of respective four corners of said first surface.

7. An electronic system comprising a plurality of electronic modules each defined in claim 5, wherein adjacent two of said electronic modules are coupled together by engagement of said lock pin of one of said adjacent two of said electronic modules with said helical groove of the other of said adjacent two of said electronic modules.

8. An electronic module as defined in claim 5, wherein said depression element is cylindrical and has a handle for rotation.

9. An electronic module as defined in claim 8, wherein a top surface of said depression element is flush with a top surface of said first surface.

10. An electronic module as defined in claim 9, wherein said depression element is rotatable between a first position and a second position, and a surface of said handle is flush with a third surface of said module housing at one of said first position and second position.

11. An electronic module comprising a module housing and an electronic part mounted by said module housing, said module housing having a first surface and a second surface opposed to each other, said first surface mounting thereon a depression element at a first location, said second surface mounting thereon a protrusion element at a second location corresponding to said first location, said depression element and said protrusion element having corresponding configurations for allowing two of said module housings to be coupled with each other, wherein one of said depression element and said protrusion element has a helical groove, the other of said depression element and said protrusion element has a lock pin having a configuration corresponding to a configuration of a cross-section of said helical groove, and one of said depression element and protrusion element is pivotally mounted by said module housing, and wherein said first surface mounts a plurality of said depression elements, and said second surface mounts a corresponding number of said protrusions.

12. An electronic module as defined in claim 11, wherein one of said first surface and said second surface mounts a plug at a third location, and the other of said first surface and said second surface mounts a receptacle at a fourth location corresponding to said third location, said plug and receptacle being connected to said electronic part.

13. An electronic module as defined in claim 12, wherein said third location is between two of said plurality of depression elements or protrusion elements.

14. An electronic module as defined in claim 12, wherein said plug and receptacle are connected to said electronic part with a signal bus.

15. An electronic system comprising a plurality of electronic modules as defined in claim 11, wherein adjacent two of said electronic modules are coupled together by engagement of said lock pin of one of said adjacent two of said electronic modules with said helical groove of the other of said adjacent two of said electronic modules.

16. An electronic module as defined in claim 11, wherein said depression element is cylindrical and has a handle for rotation.

17. An electronic module as defined in claim 16, wherein a top surface of said depression element is flush with a top surface of said first surface.

18. An electronic module as defined in claim 17, wherein said depression element is rotatable between a first position and a second position, and a surface of said handle is flush with a third surface of said module housing at one of said first position and second position.

* * * * *